United States Patent [19]

Lusignan et al.

[11] Patent Number: 5,391,983
[45] Date of Patent: Feb. 21, 1995

[54] SOLID STATE ELECTRIC POWER USAGE METER AND METHOD FOR DETERMINING POWER USAGE

[75] Inventors: Bruce B. Lusignan, Stanford; Behruz Rezvani, Cupertino, both of Calif.

[73] Assignee: K C Corp., New Rochelle, N.Y.

[21] Appl. No.: 773,011

[22] Filed: Oct. 8, 1991

[51] Int. Cl.6 ............................................ G01R 21/06
[52] U.S. Cl. .................................... 324/142; 364/483
[58] Field of Search ............. 324/142, 141, 111, 76 R; 364/483

[56] References Cited

U.S. PATENT DOCUMENTS

| | | | |
|---|---|---|---|
| 3,984,737 | 10/1976 | Okamura | 364/492 |
| 4,077,061 | 2/1978 | Johnston et al. | 364/483 |
| 4,174,499 | 11/1979 | Waurick | 324/142 |
| 4,300,125 | 11/1981 | Loshing et al. | 324/142 |
| 4,356,553 | 10/1982 | Steinle et al. | 324/76 R |
| 4,509,128 | 4/1985 | Coppola et al. | 364/483 |
| 4,713,608 | 12/1987 | Catiller et al. | 324/142 |
| 4,978,911 | 12/1990 | Perry et al. | 364/483 |
| 5,216,357 | 6/1993 | Coppola et al. | 324/142 |

FOREIGN PATENT DOCUMENTS

| | | |
|---|---|---|
| 0181719 | 5/1986 | European Pat. Off. . |
| 0342146 | 11/1989 | European Pat. Off. . |
| 0420535 | 4/1991 | European Pat. Off. . |
| 0440962 | 9/1991 | European Pat. Off. . |
| 9012325 | 10/1990 | WIPO . |

OTHER PUBLICATIONS

"Dithering Increases Dynamic Range and Improves Linearity", Federal Scientific Corporation, Aug. 24, 1973.

"Digital Wattmeter Using a Sampling Method", Turgel, Raymond S., IEEE Transactions of Instrumentation and Measurement, vol. IM-23, No. 4, Dec. 1974.

*Primary Examiner*—Ernest F. Karlsen
*Attorney, Agent, or Firm*—Ostrolenk, Faber, Gerb & Soffen

[57] ABSTRACT

A digital solid state electric power usage meter for determining power usage by a load attached to an electric power network. The meter has a current sensor coupled to each phase of the electric power network for sensing current in each phase, a voltage divider coupled to each phase of the power network for detecting the voltage level on each phase, an analog to digital (A/D) converter coupled to the current sensors and voltage dividers receiving signals from the current sensors related to the current in each phase and signals from the voltage dividers related to the voltage on each phase. The A/D converter samples the current and voltage related signals at predetermined times at a rate which insures that samples of the current and voltage related signals do not repeat for a large number of cycles of the network frequency or never repeat and which rate is at least twice as fast as the rate of change of the current and voltage related signals and converts the samples to digital signals representing the voltage levels and current at the predetermined times. A processor calculates instantaneous values of power at the predetermined times from the digital signals and a memory accumulates the instantaneous values so as to form a value representative of electric power usage by the load attached to the network.

43 Claims, 11 Drawing Sheets

F I G. 1
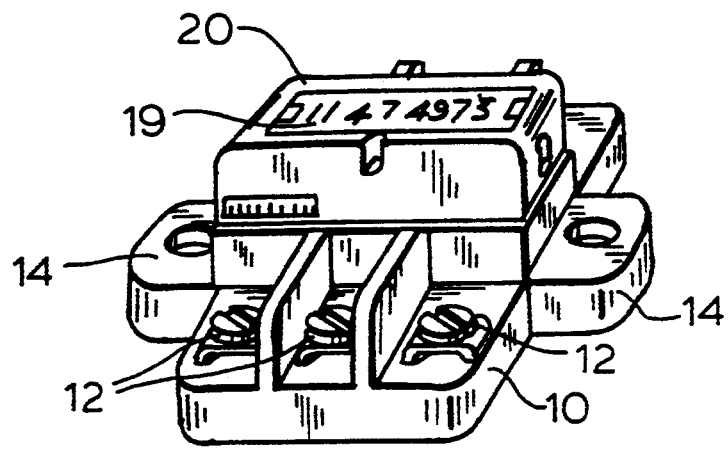
F I G. 2
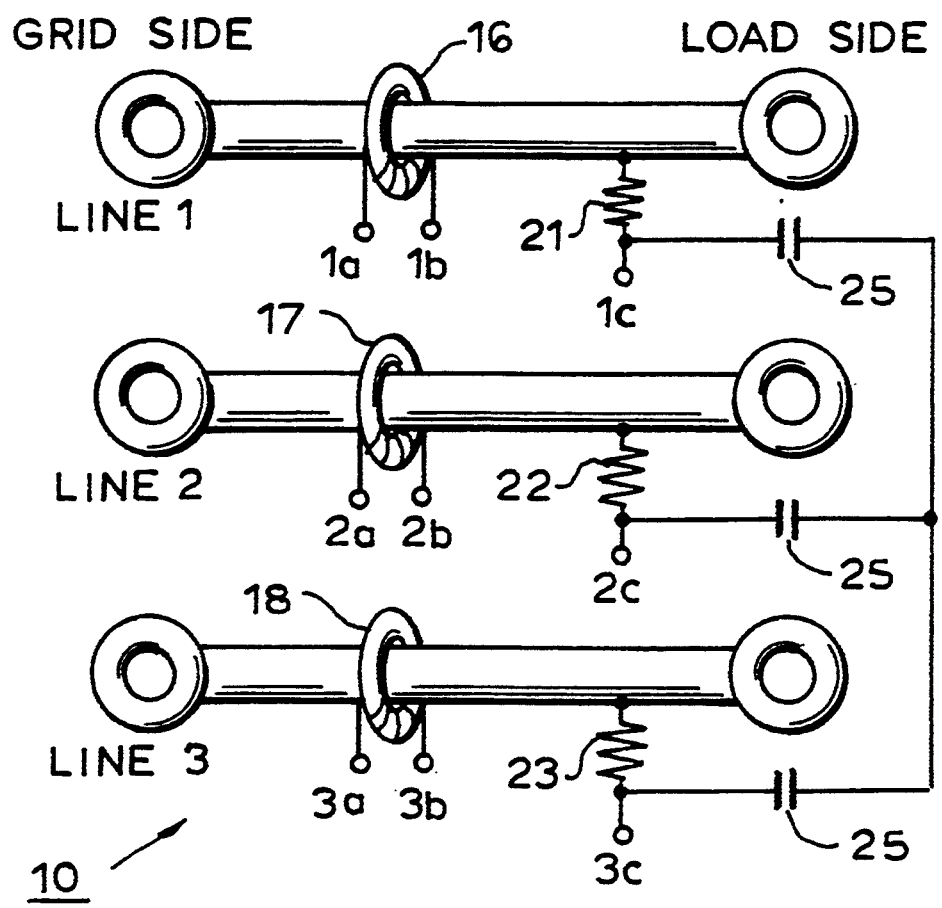

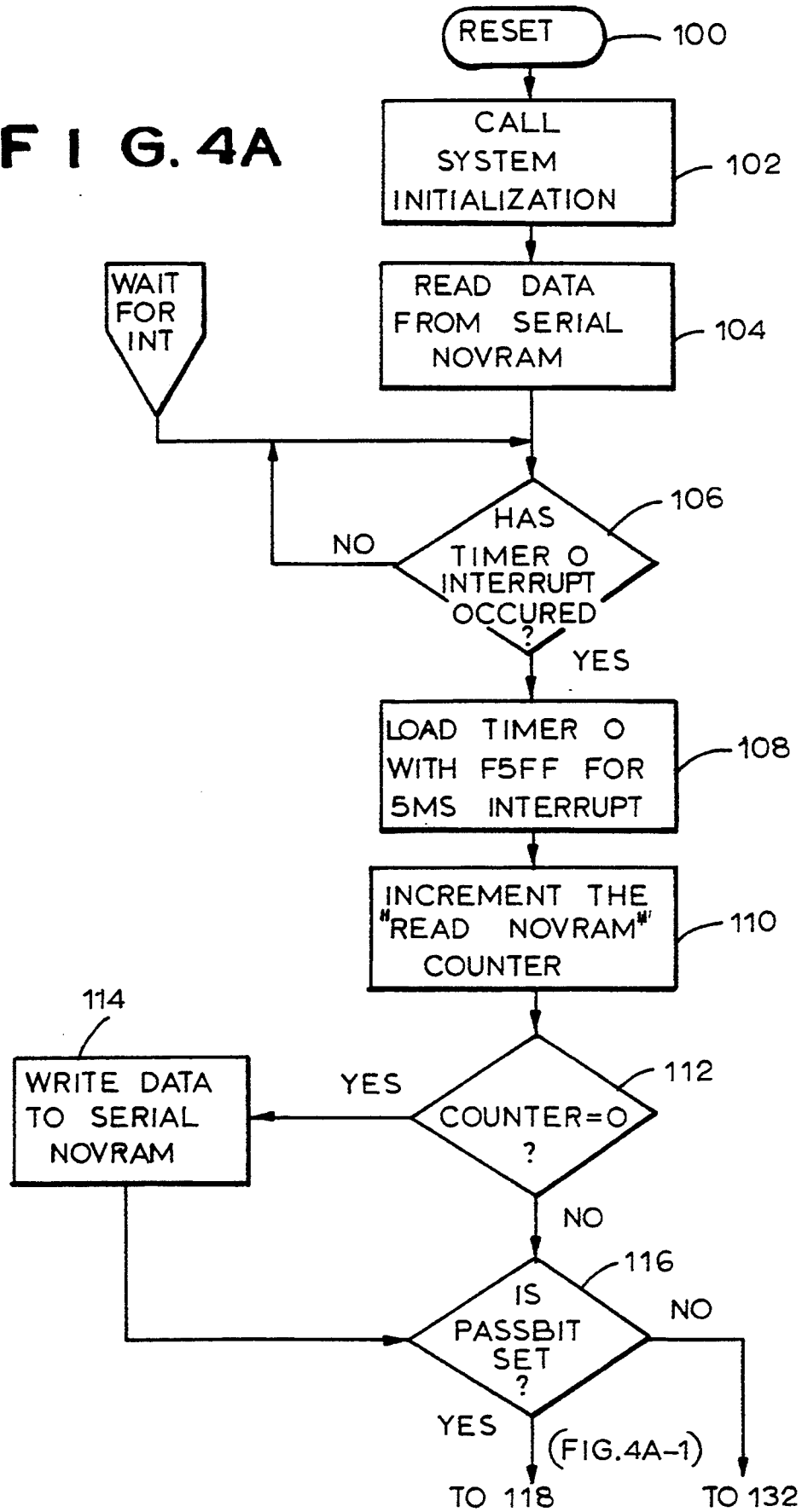

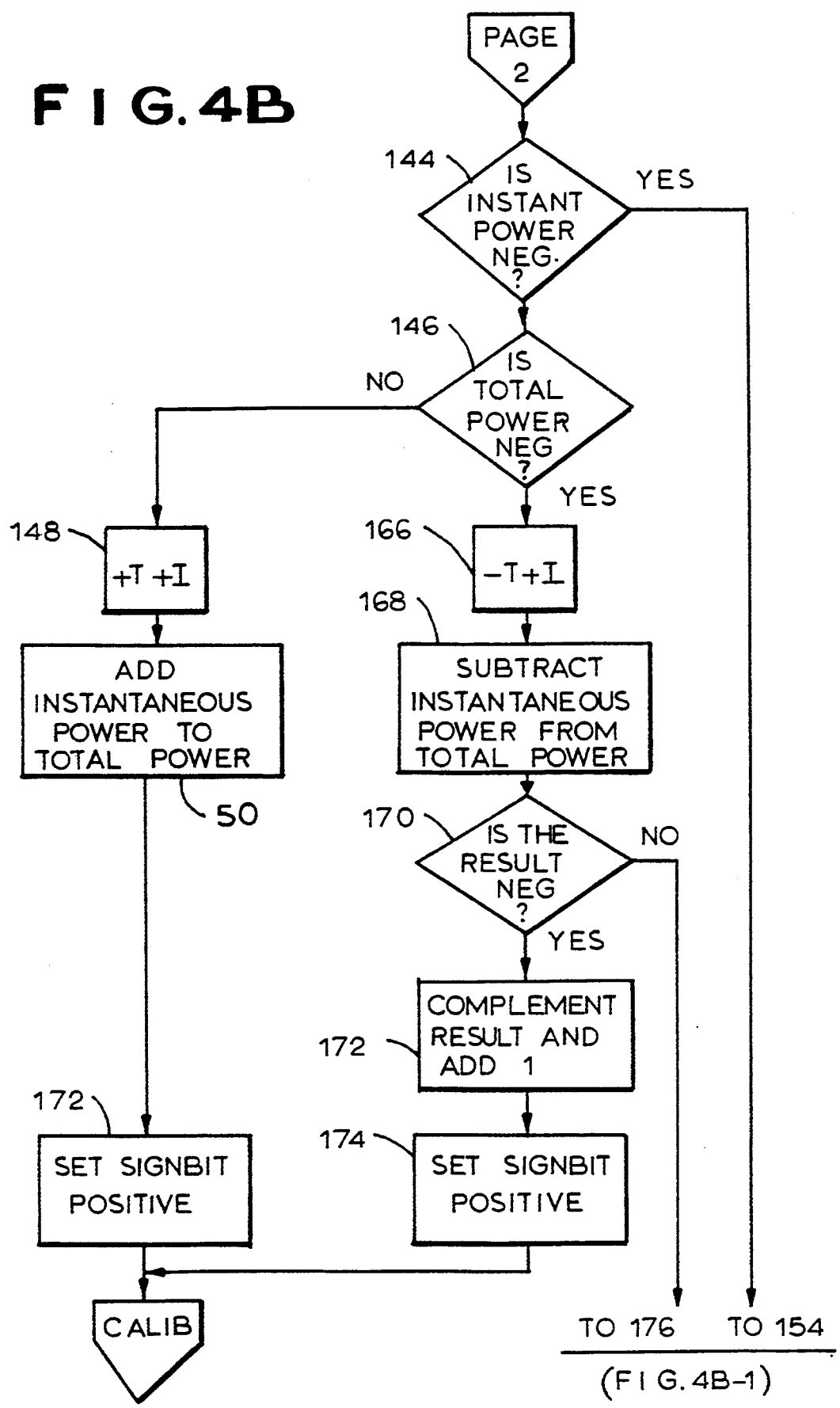

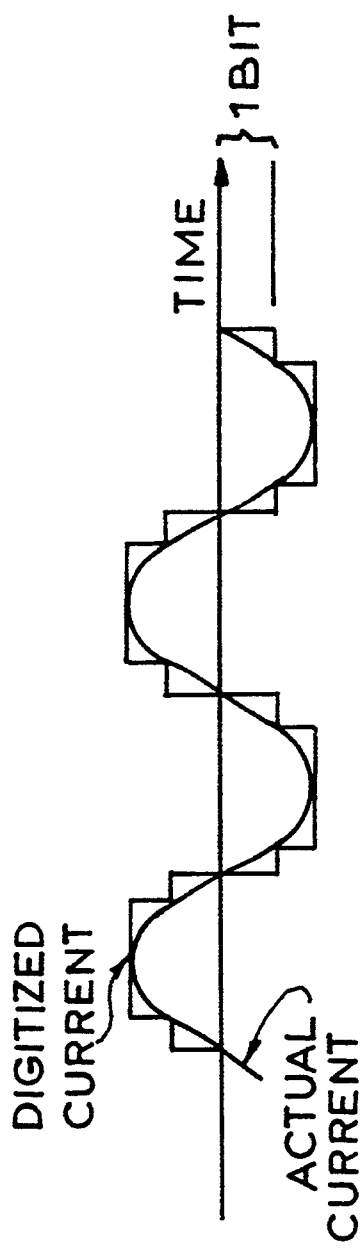
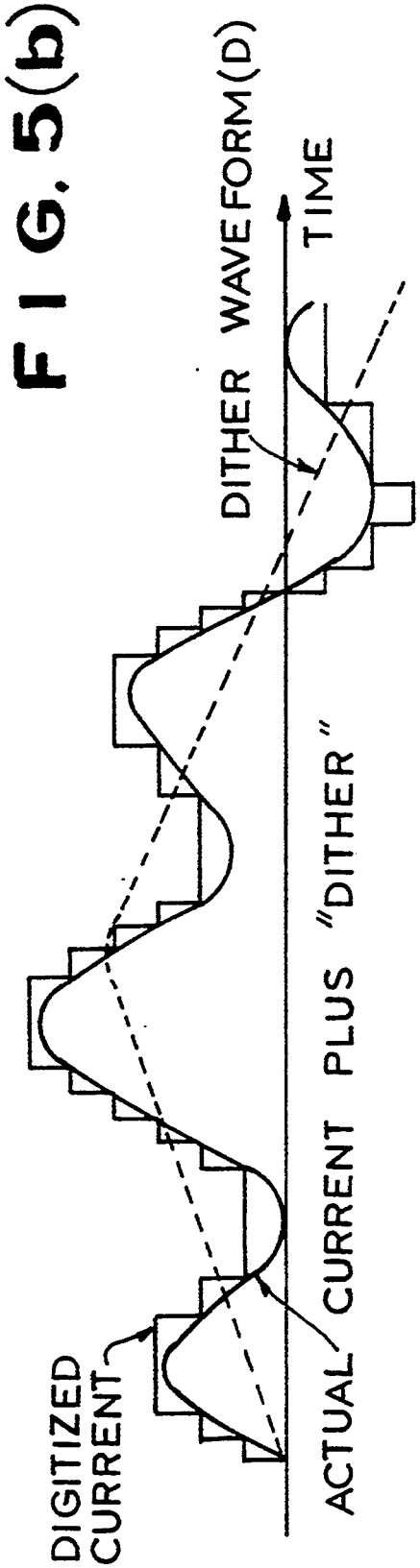

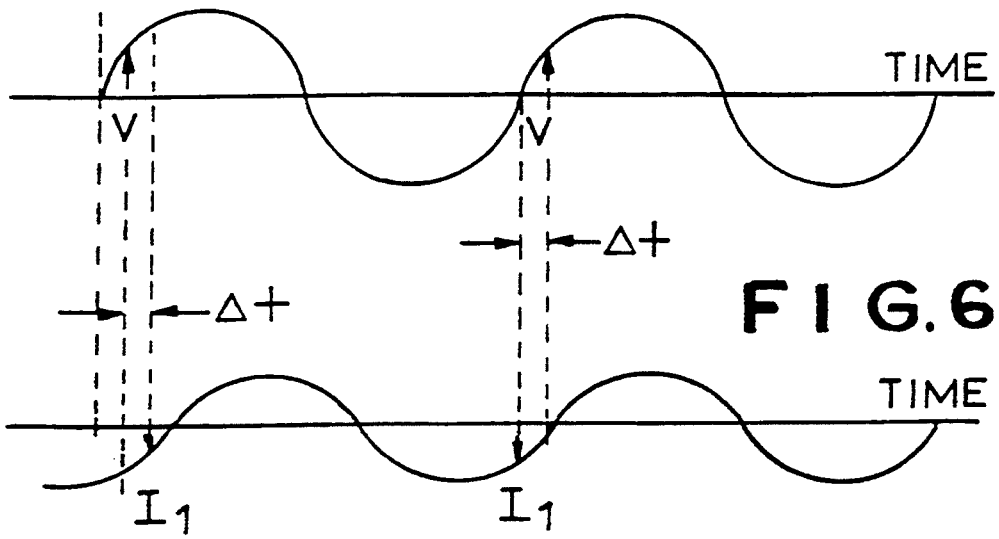
FIG. 6(a)
FIG. 6(b)
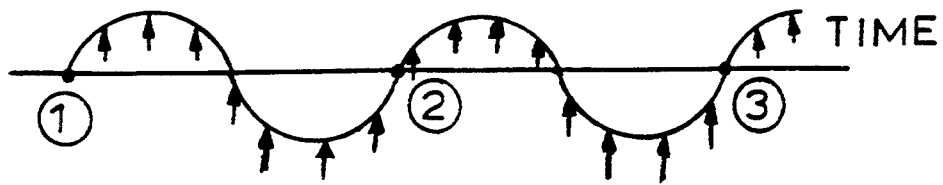
FIG. 7(a)
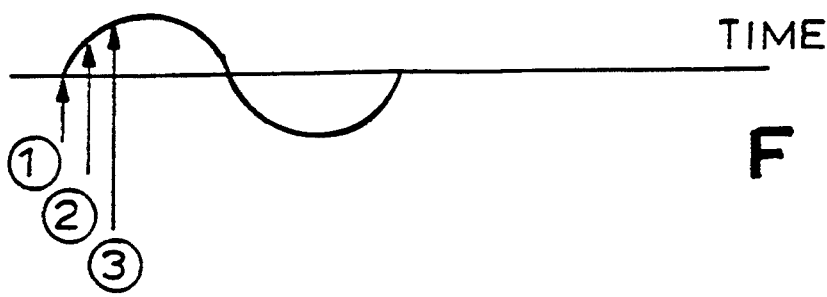
FIG. 7(b)

SOLID STATE ELECTRIC POWER USAGE METER AND METHOD FOR DETERMINING POWER USAGE

BACKGROUND OF THE INVENTION

The present invention relates to electric power usage meters and, in particular, to an electric power usage meter employing digital electronic solid-state technology for accurately and inexpensively determining electrical power usage. The present invention relates to such an electronic electrical power usage meter which is useful both for residential and industrial applications, and with single, dual and other multiphase electrical grids. The invention further relates to methods for electrical power usage measurement.

There is not yet available an electric power usage meter based upon solid-state digital electronic technology that is as accurate or as inexpensive as the electromechanical units currently used. The purchase price of the electromechanical units in large volumes is between $25 and $30 per unit. The cost, reliability and accuracy at both high and low loads has not as yet been matched by present solid-state designs.

SUMMARY OF THE INVENTION

It is an object of the present invention to provide a solid-state electric power usage meter which will accurately and inexpensively determine electric power usage.

It is a further object of the present invention to provide such an electric power usage meter which is useful both for residential and industrial applications.

It is yet still a further object to provide such an electronic solid state electric power usage meter which is capable of being applied to single and dual phase electrical power grids, in residential use, and furthermore which can be used to determine electric power usage in three-phase or any other multiphase power grid, more common in industrial facilities.

It is still a further object of the present invention to provide an electric power usage meter which employs digital electronic technology, and, in particular, allows an inexpensive microprocessor, e.g., an 8-bit microprocessor, to determine power usage.

It is still another object of the present invention to provide a digital electronic electric power usage meter which allows fewer samples of the analog voltage and current waveforms to be taken than otherwise would appear necessary according to traditional sampling concepts.

It is yet still a further object of the present invention to provide such an electronic electric power usage meter which is accurate both at low loads and high loads of usage.

It is yet still another object of the present invention to provide such an electronic electric power usage meter which is capable of automated reading and the reading of additional parameters other than power usage, such as load factor, that are not normally available in conventional electric power usage meters.

It is still yet a further object of the present invention to provide such an electronic electric power usage meter which can be used with single, two or three-phase electrical networks with no change to the electronic circuitry of the meter.

The above and other objects of the present invention are achieved by an electric power usage meter for determining electric power usage by a load attached to an electrical power network, the meter comprising first means coupled to each phase of the electric power network for sensing current in each phase; second means coupled to each phase of the electric power network for detecting the voltage level on each phase; third means coupled to the first and second means receiving signals from the first means related to the current in each phase and signals from the second means related to the voltage on each phase, the third means comprising means for sampling the current and voltage related signals at predetermined times and for converting the samples to digital signals representing the current and voltage levels at the predetermined times; and processor means for calculating instantaneous values of power at the predetermined times from the digital signals and means for accumulating the instantaneous values of power so as to form a value representative of electrical power usage by the load attached to the network.

The above and other objects are furthermore achieved by an electric power usage meter for determining electric power usage by a load attached to an electric power network, the power usage meter comprising: first means coupled to each phase of the electric power network for sensing current in each phase; second means coupled to each phase of the electric power network for detecting the voltage level on each phase; third means coupled to the first and second means receiving signals from the first means related to the current in each phase and signals from the second means related to the voltage on each phase, the third means comprising means for sampling the current and voltage related signals at predetermined times at a rate which insures that samples of the current and voltage related signals do not repeat for a large number of cycles of the network frequency or never repeat and which rate is at least twice as fast as the rate of change of the current and voltage related signals and for converting the samples to digital signals representing the current and voltage levels at the predetermined times; processor means for calculating instantaneous values of power at the predetermined times from the digital signals; and means for accumulating the instantaneous values so as to form a value representative of electrical power usage by the load attached to the network.

The objects of the invention are also achieved by a method for determining electric power usage by a load attached to an electric power network, the method comprising: sensing current in each phase of the electric power network; detecting the voltage level of each phase of the electric power network; receiving signals related to the current in each phase and signals related to the voltage on each phase; sampling the current and voltage related signals at predetermined times and converting the samples to digital signals representing the current and voltage levels at the predetermined times; calculating instantaneous values of power at the predetermined times from the digital signals; and accumulating the instantaneous values so as to form a value representative of electrical power usage by the load attached to the network.

The objects of the invention are further achieved by a method for determining power usage by a load attached to an electric power network, the method comprising: sensing current in each phase of the electric power network; receiving signals related to the current in each phase and signals related to the voltage on each phase, sampling the current and voltage related signals at predetermined times at a rate which insures that samples of the current and voltage related signals do not repeat for a large number of cycles of the network frequency or never repeat and which rate is at least twice as fast as the rate of change of the current and voltage related signals and converting the samples to digital signals representing the current and voltage levels at the predetermined times; calculating instantaneous values of power at the predetermined times from the digital signals; and accumulating the instantaneous values so as to form a value representative of electrical power usage by the load attached to the network.

Other objects, features and advantages of the present invention will become apparent from the detailed description which follows.

BRIEF DESCRIPTION OF THE DRAWINGS

The invention will be described in greater detail in the following detailed description with reference to the drawings in which:

FIG. 2 shows the connections of the solid state electric power usage meter according to the invention to the power network and load;

FIGS. 5($a$) and 5($b$) illustrate how the invention accomplishes accurate determination of low current levels by dither sampling;

FIGS. 6($a$) and 6($b$) illustrate how systematic sampling errors can be eliminated by the power usage meter according to the invention;

FIGS. 7($a$) and 7($b$) illustrate how asynchronous sampling can be used according to the invention more accurately to sample an electrical waveform.

DETAILED DESCRIPTION OF THE DRAWINGS

Figures 1, 4A:
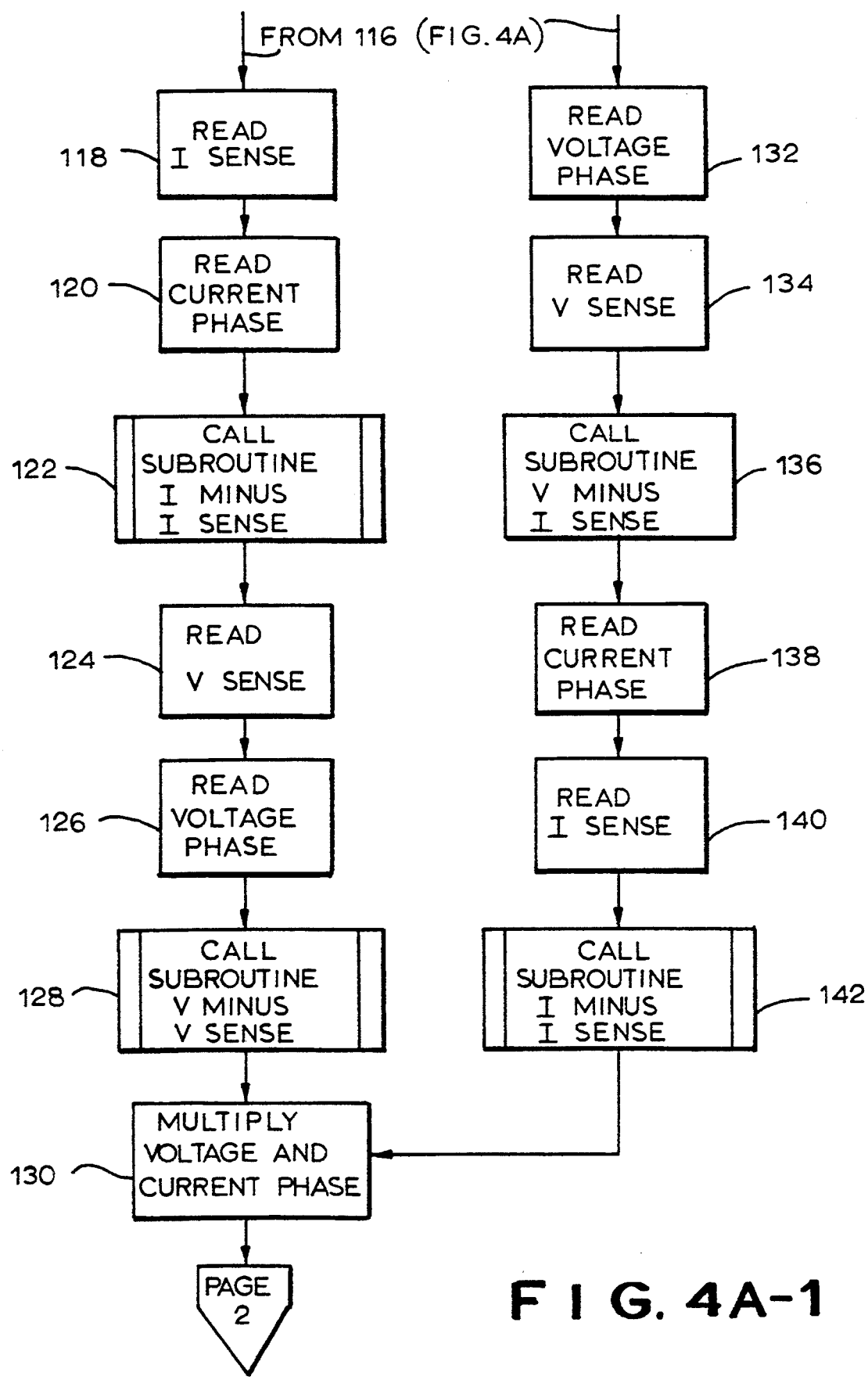
FIG. 1 shows a perspective view of an embodiment of the digital electronic solid-state electric power usage meter according to the invention.
FIGS. 4A, 4B and 4C-comprise, collectively, a flowchart of the software for the digital electronic power usage meter, according to the invention, applied to a two-phase network, but equally applicable to a three-phase network.

With reference now to the drawings, FIG. 1 shows a perspective view of an embodiment of the digital electronic solid-state electric power usage meter according to the invention. The meter may be made in two parts, a terminal block 10, and a processor/display block 20 mounted on the terminal block 10. The terminal block 10 includes suitable lugs 14 for attachment to a base plate for the meter. As shown in FIG. 1, three incoming power lines are to be terminated at terminals 12, and, similarly, three outgoing terminals are connected to the load, on the opposite side of the meter, not shown. These lines may represent the three phases of a three-phase network or the two phases and neutral of a two-phase network. Connections on each line from input to output are by heavy gauge copper, giving essentially no voltage drop. The current in each line is sensed by a current transformer, for example, a ferrite ring wound with a coil. The current transformers are shown in FIG. 2 at 16, 17 and 18, for a three-phase network, which Figure shows the circuitry of the terminal block 10.

Current-sensing in each line gives an accurate, instantaneous measure of current in the line and provides voltage isolation and current surge isolation, for example, through saturation of the ferrite core, to protect the processor/display block 20.

Figure 3:
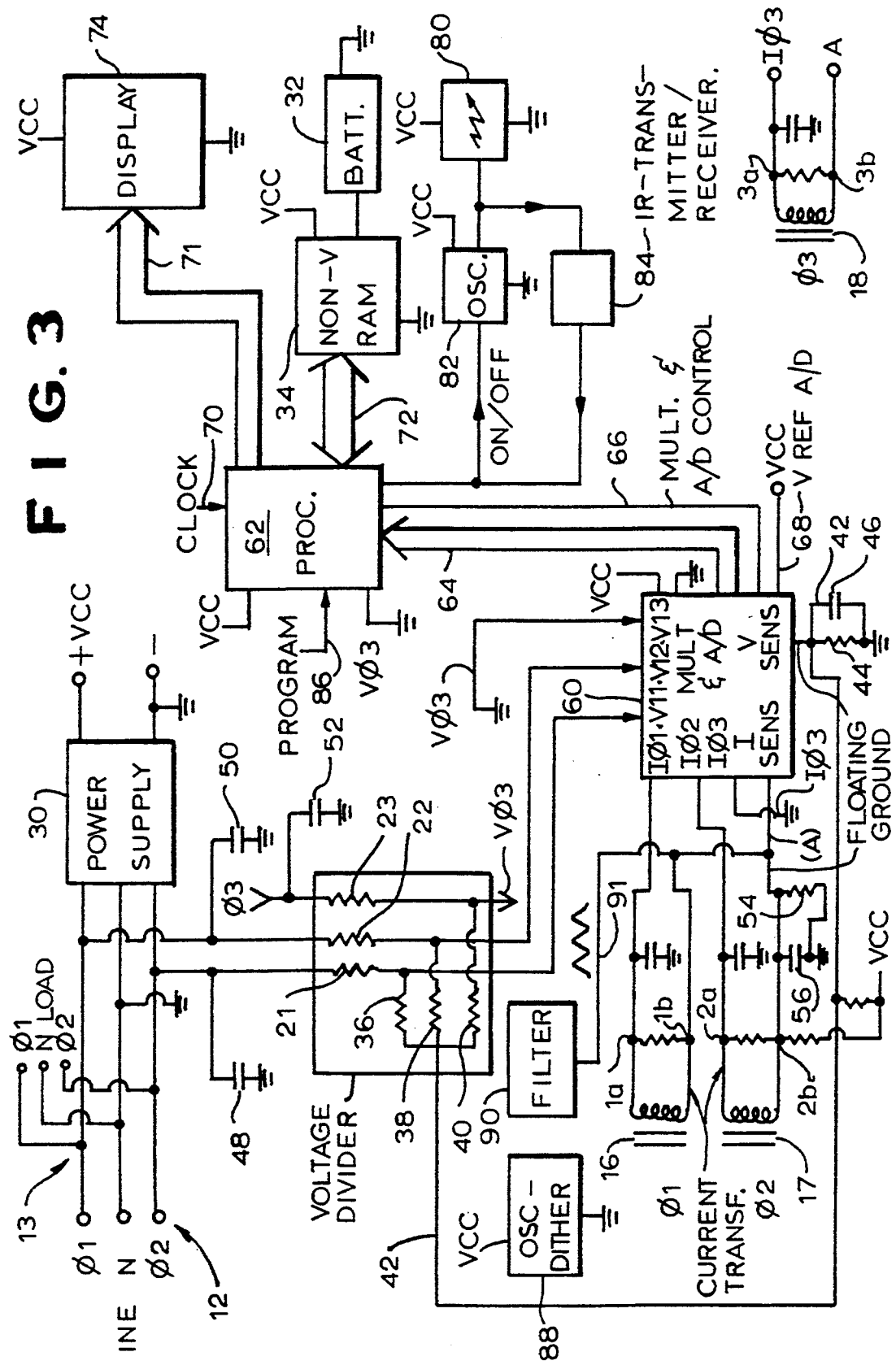
FIG. 3 is a block/schematic diagram of the solid state electric power usage meter according to the invention, showing it applied to a two-phase network, with connections shown provided for application to a three-phase network, without change to the circuit.

As shown in FIG. 2, a current transformer 16,17,18 is provided for each line, here illustratively the three phases of a three-phase network. If a two-phase network supplies power, only two current transformers are necessary. A resistor 21,22,23 comprising part of a voltage divider, to be described in greater detail with reference to FIG. 3, is connected to each line, and the terminal point 1$c$,2$c$,3$c$ is connected in the voltage divider arrangement to the processor/display block circuit, shown in more detail in FIG. 3. The voltage dividers are used for voltage detection on each line. Suitable pulse bypass capacitors 25 can be employed for lightning and surge protection, and other devices for providing surge protection, for example, metal oxide varistors, can also be coupled to each line.

The resistors 21,22,23 preferably are very large resistances, for example, approximately 9 megohms, to provide both instantaneous voltage sensing and isolation of the processor/display block 20 from line voltage surges, and of high tolerance for accuracy.

For residential applications, the windings on the current transformer coils 1$a$,1$b$,2$a$,2$b$,3$a$,3$b$ may be about 1,000 turns. For other applications of higher current or voltage, the number of turns and the resistor values may be changed. In such applications, the insulator design and connection design of the terminal block may be changed, as well, to suit the industry standard. Although the terminal block may, therefore, be changed to suit industry requirements, the processor/display block body and circuitry 20 should not be changed, to keep costs to a minimum.

The processor/display block 20 preferably snaps onto the terminal block 10, both mechanically and electrically, and is held by a tamper-proof seal, not shown. The processor/display block preferably has a digital readout 19, for example, an LCD readout. In addition, the processor/display block also preferably includes a read-write device, e.g., an infrared isolator read-write device, for simple meter reading or for connecting to a continuous monitoring system. A read gun may be held over the meter, the trigger may be pulled, and the meter identification, existing power usage reading and other optional data are transferred to the infrared read gun for later use in billing or status determination.

A block/schematic diagram for the digital solid state electric power usage meter is shown in FIG. 3.

The power usage meter according to the invention comprises connections to the network, shown at 12, and connections to the load 13. A power supply 30 is connected to the network, and supplies suitable voltage Vcc for powering the meter. In addition, a battery 32 is provided as a source of power for the meter in the event of a power outage. The battery 32 provides a source of power for powering the device in a shutdown mode, which essentially enables the device to store the last readings prior to the power outage in a non-volatile RAM 34.

In FIG. 3, connections 12,13 have been shown for a two-phase network ($\phi_1, \phi_2$), but the connections for the third phase of a three-phase network are also shown by suitable designations for the third phase ($\phi_3$). The current transformer 18 for the third phase is shown in FIG. 3, as well as the current transformers 16,17 for the two-phase network, shown coupled into the processor/display block circuit diagram. These connections will be explained in greater detail below.

As discussed with respect to FIG. 2, the resistors 21,22 for a two-phase network, and an additional resistor 23 if a three-phase network is being monitored, are provided in a voltage divider 35. The points 1c,2c,3c of the resistors 21,22,23 are connected to suitable like tolerance resistors 36,38,40 as shown. Resistors 21,22,23 and 36,38,40 are preferably precision resistors, so as to insure accuracy of the readings for each phase and also between phases. The common connection point of resistors 36,38,40 comprises a floating ground 42, which is coupled to system ground by a resistor 44 and a bypass capacitor 46. Pulse bypass capacitors 48,50,52 may also be provided, coupled to each phase of the network, as shown, for providing transient and lightning suppression. As discussed, other suitable devices can also be employed, for example, metal oxide varistors, for this purpose.

The current transformers 16,17 for two phases, and 18, if a three-phase network is being monitored, are coupled into the processor/display block circuit such that their common point is connected to a floating ground A, which is connected to system ground by a resistor 54 and bypass capacitor 56. The reason for the floating ground A will be explained in greater detail, but the floating ground is important to accurate measurement because often there is a potential difference between actual earth ground and the neutral or null conductor of a power network. Furthermore, the isolated floating ground provides a convenient point for the introduction of a special "dither" signal useful for accurate measurement of low current levels.

The measure of the instantaneous current from each of the current transformers is fed to a multiplexer and analog-to-digital converter 60, which may be a type ADC0838. The instantaneous voltage levels at points 1c, 2c,3c of the voltage divider 35 are also provided to the multiplexer and analog-to-digital converter 60. The output of the multiplexer and analog-to-digital converter 60, which comprises a stream of instantaneous samples of the voltage and current, are fed to a processor 62, comprising a microprocessor, via a bus 64. The microprocessor may be an inexpensive 8-bit microprocessor such as an SC87C51, due to the unique sampling method used in the invention, which allows fewer samples to be taken than would otherwise appear necessary, as explained in more detail below. Control for the multiplexer and analog-to-digital converter 60 is provided by a control bus 66. A voltage reference is also provided for the multiplexer and analog-to-digital converter at 68, expediently coupled to the supply voltage.

A suitable clock generator is coupled to the microprocessor at 70, for providing system timing, and the non-volatile RAM 34 is coupled to the microprocessor by a bus 72. The display device 74, for example, an LCD display having low power requirements, is coupled to the processor by a bus 76.

In addition to the above, a transmit/receive port of the processor 62 is coupled to an infrared transmitter/receiver 80. The infrared transmitter/receiver 80 receives signals from the processor comprising digital ON/OFF data modulated by an oscillator 82. For reception, a suitable decoder 84 is provided for converting the received pulses into suitable digital data for receipt by the processor. In addition, a program port 86 can be provided for external programming of the processor.

When current is read at low levels, and at levels such that it is below the resolution level of the analog-to-digital converter (illustratively 8 bits), a noise or dither signal is added to the current measurement signals. This noise or dither signal is supplied by an oscillator 88 which may provide a square wave output, filtered by a filter 90 into, for example, a sinusoidal or triangular signal on line 91. This dither signal is applied to the floating ground A, which is the common point for the current transformers. The floating ground A is coupled to the input terminal ISENSE of the multiplexer-/analog-to-digital converter 60. The ISENSE line provides a reference level for the multiplexer/analog-to-digital converter 60.

The dither signal should be uncorrelated to the current waveform, and therefore any waveform that is incoherent to the 60 Hz line current is satisfactory. A suitable dither signal would be, for example 101 Hz, provided through low-pass filter 90 to generate a sawtooth waveform. This dither signal will swing about 3 bits of the analog-to-digital converter output. The use of this dither signal, superimposed on the current signal, thereby allows the A-D converter to measure currents at low levels. For example, if the A-D converter has 8 bits of resolution and currents of up to 100 amps are to be measured, there are 256 discrete levels which can be measured, meaning that all currents equal to or below approximately 0.4 amps would be read as zero. With the dither signal, at low current levels, about 3 bits of swing of the A-D converter output is provided, thus assuring that even currents below 0.4 amps will be within the resolution of the A-D converter.

With reference to FIGS. 5(a) and 5(b), the incremental error of the digitized small current waveform of FIG. 5(a) is eliminated by adding the internally generated dither waveform D of FIG. 5(b) to cause the systematic resolution error to be randomized. The dither waveform is non-synchronous with the line frequency and has zero average value. This ensures that the dither signal adds no net power to the calculation. The dither waveform, however, provides for greater accuracy in allowing more samples of the waveform at low current levels to be taken. As shown in FIGS. 5(a) and (b), the samples are such that once the sample threshold is exceeded, the sampled signal attains a sample level above the threshold. Each sample level above the threshold is the same height. The individual sample times are not shown in FIGS. 5(a) and 5(b), but as described later, the rate is such that it insures that samples of the current and voltage related signals do not repeat for a large number of cycles of the network frequency, e.g., one thousand cycles of the network frequency, or never repeat; for example, the rate may be an irrational fraction of 60 Hz, such as 59.9, 60.1 or 120.1 Hz, without limitation. A rate which is an integral multiple of the network frequency would not insure proper sampling.

At low signal levels, this technique virtually eliminates the normal systemic bit resolution error for the average power calculation.

Returning to FIG. 3, the processor 62 drives the display 74 to show the watt-hours of consumption on a continuous basis. In addition, the processor periodically checks the infrared device 80 to see if a data transmission is requested. If a read-in code is received through the infrared input, the requested data is read out. The parameters read out include the watt-hour reading and the meter identification, stored in RAM 34. The last reading and the meter identification are continuously stored in the nonvolatile RAM 34. Other parameters which can be read out include the load factor, balance analyses, etc. The parameters read out are not reset by the processor. This prevents loss of data by unauthorized readings.

The major source of error, in prior art meters, is the calculation of the power, including the effects of the load factor. The load factor is the angle between voltage and current. The actual power to the load, where a waveform is sinusoidal, is taken to be the A-C voltage (rms) measured multiplied by the A-C current (rms) measured multiplied by cos Θ where Θ is the phase angle difference between voltage and current. In a substantially resistive load, Θ nearly equals 0° and the role of the power factor is unimportant or small. In motor equipment, the power factor varies widely as load is put on and taken off. Θ can go plus and minus and can even exceed ±90°, which in effect means that power is being returned to the network.

Thus, Θ varies rapidly in time and a system that assumes it is steady will encounter very large errors.

Another problem with the prior art meters with respect to power factor is that the concept of a 60 Hz power factor is approximate. It assumes that both the voltage and the current are single frequency sine waves. However, generally, they are not strictly sinusoidal. Home equipment now uses Silicon Controlled Rectifiers (SCR's) in dimmer switches to switch loads on and off during part of each 60 Hz cycle. Multi-pole motors introduce many harmonics to the current load at 120 Hz, 180 Hz, etc. Because of this, there is no simple phase angle between voltage and current that can be measured to relate current and voltage to power. Any attempt to measure the angle and calculate the power will be accurate only on one loading circumstance and will fail on the wide variety of loads actually encountered in the home and factory.

In the past, electromechanical meters solved this problem by running the current and voltage actually sensed through coils of a small motor. The instantaneous power actually going into the load is scaled down and runs the electromechanical motor. Distortion and harmonics are automatically reflected in the instantaneous torque of the motor and the inertia of the rotor averages the power through rapid variations.

In the meter according to the present invention, no assumption is made about phase angles. Preferably, 166.6 samples are made by the multiplexer and A/D converter 60 during each cycle of 60 Hz for each of the phases. The instantaneous power flow is calculated each 0.1 millisecond. This is averaged continuously and used to advance the power measured as each watt second is accumulated. Since the voltage and current measurements are instantaneous, there is no assumption that the waveforms are sinusoidal, and therefore the power measured for each sample is the actual power consumed, and the accumulated total of these actual powers over time reflect the total actual power consumed.

In order to provide high sensitivity, the processor 62 averages many instantaneous samples of the voltage and current before performing the multiplication leading to the power consumption. Since the voltage and current are instantaneous-values, the product of the voltage and current will result in an instantaneous power measurement. This is in contrast to prior art electronic electric power usage meters, which do not read voltage and current on an instantaneous basis, but, instead, read the voltage and current peaks, assuming a sinusoidal waveform, and then determine points of zero crossing to determine the angular difference between voltage and current to determine power factor. The power factor is then multiplied by the rms voltage and current readings to determine power. This leads to inaccuracies, as discussed above, because often the waveforms of the voltage and current are not strictly sinusoidal, due to inductive and capacitive loads, and the power factor calculation assumes a sinusoidal waveform. In the present invention, the instantaneous measurement of voltage and current at a number of times over the course of a cycle of a waveform and accumulation of power values over time leads to an extremely accurate determination of the power consumed, because no assumption is made as to the sinusoidal nature of the voltage and current.

In the present invention, the processor 62 preferably samples voltage and current of each phase, as discussed, about every 0.1 milliseconds. Accordingly, within each second, 10,000 readings for each phase are made. With this averaging, the precision of the 8-bit analog-to-digital conversion is extended for better accuracy than is required by the electric power industry. The 8-bit converter has a precision of 0.3% of full scale for each sample. This precision is increased to 0.003% of full scale with averaging over one second.

Figure 8:
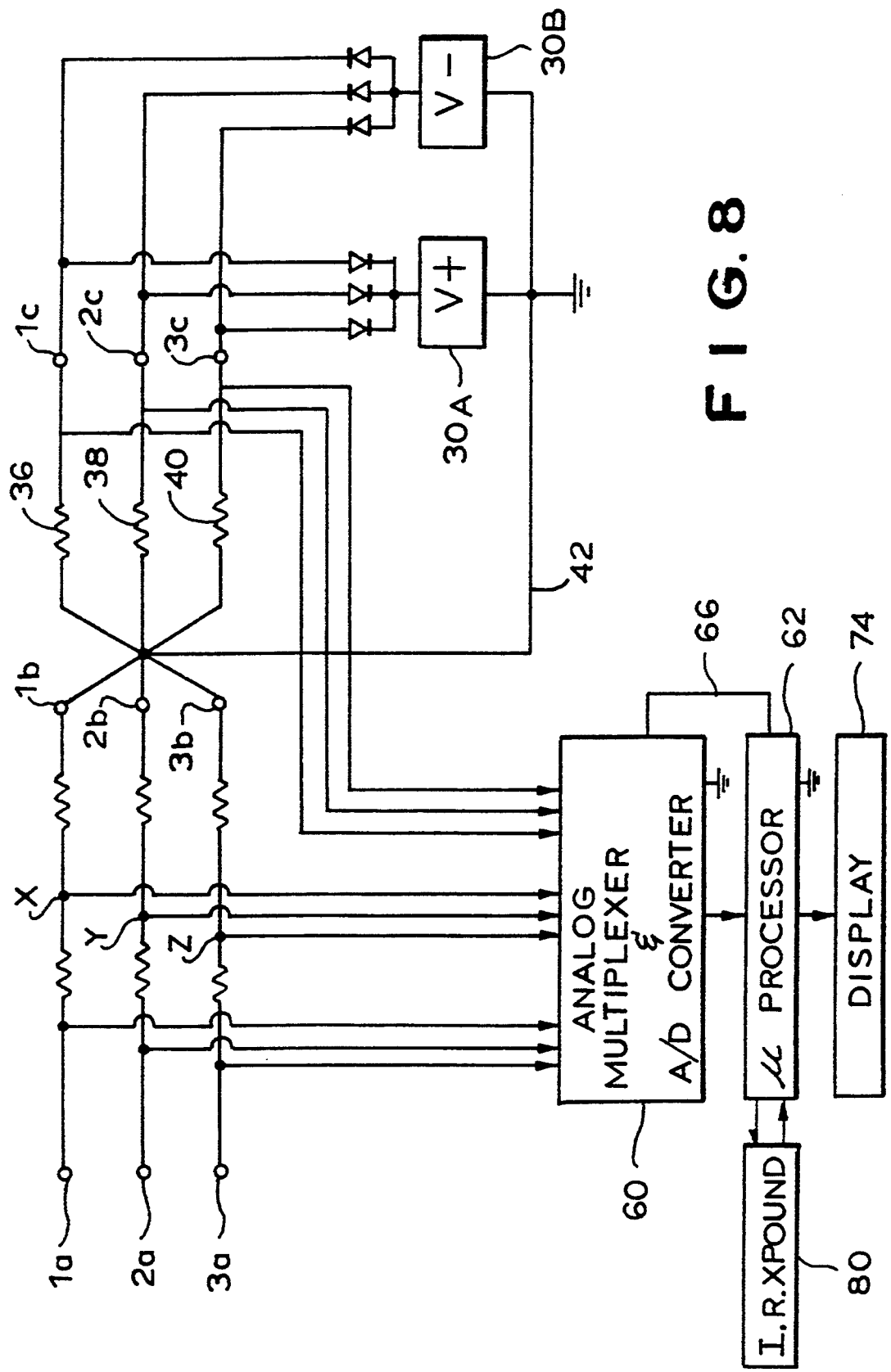
FIG. 8 shows a further embodiment of input circuitry for the electrical power usage meter connected to the power network.

In order to provide even greater accuracy, the current readings can be made in two stages, by using voltage dividers, as shown in FIG. 8. This will increase the dynamic range of the electric power usage meter. This can be implemented by suitable switching of the current range monitored by the analog multiplexer and A-D converter 60. The multiplexer and A-D converter reads from the one range (taps x, y and z) for high currents and from the other range (taps 1a, 2a and 3a) for low currents. For intermediate current states, both ranges can be read and averaged. This can increase the sensitivity of the device for lower currents.

In FIG. 8, two power supplies 30A and 30B are shown, which can be provided for supplying both positive and negative voltage supplies, as necessary.

The improved precision of the power usage meter according to the invention due to averaging is dependent upon non-synchronous sampling. This is accomplished, as discussed, by sampling at a frequency which insures that samples of the current and voltage related signals do not repeat for a large number of cycles of the network frequency or never repeat. For example, this may be accomplished by using a sampling frequency which is an irrational fraction of the 60 Hz network frequency, which insures that the pattern of samples technically never repeats (sampling is always nonsynchronous) or by using a frequency such that the repetition in samples only occurs after a large number of cycles of the network frequency, e.g., 1,000 cycles of network frequency. By using an irrational fraction of 60 Hz, theoretically, the same point on a cycle of the sampled waveform will never be sampled again, thus insuring that the nonsinusoidal nature of a loaded waveform will be sampled accurately.

The precision of the meter according to the invention also depends on the precision of the initial calibration and the time variability of the voltage divider resistors. These introduce systematic errors not eliminated by averaging. The systematic errors are measured during calibration and stored to correct the measured results.

The electric power usage meter according to the invention is based on integrating the instantaneous power, defined by V×I, over time, rather than measuring the rms Voltage, rms Current, and phase angle, which must assume low distortion in the current waveform. The invention utilizes a novel sampling method in order to reduce the number of samples which need to be made, and therefore reducing the speed, size and expense of the processor 62.

Normally, instantaneous measurement of V×I would require many samples during one cycle. If the 20th harmonic distortion of the 60 cycle line frequency was to be measured, then the sample rate would need to be 2×20×60=2400 samples per second according to the Nyquist sampling theorem. To accomplish this would take a very fast and expensive processor. It has been observed that the actual sampling limitation is not related to the harmonic of 60 Hz, but to the rate of change of the waveform. If the waveform is unchanged over 10 minutes, for example, the samples need to be obtained in 10 minutes, not in one cycle of 60 Hz. The only limitation is that these samples must be evenly distributed over the waveform, not biased to one or more sample points in the 60 Hz waveform. The preferred choice of an irrational fraction of 60 Hz or at least a rate which insures that samples only repeat after a large number of network cycles guarantees the sample distribution required.

Another feature of the invention is that sampling, averaging and integrating are combined into one very fast process. A more conventional approach would be to average the samples taken over time to determine the V and I waveforms. Then V×I would be integrated over one cycle and the result multiplied by the number of cycles in the time period to obtain the power. This process is accurate, but impossible to accomplish with a small processor. In the meter according to the present invention, this computationally intensive approach has been bypassed by observing that, mathematically, the result is the same as taking V×I samples at a much lower rate and adding them into the power accumulator. The result is the same as the more intensive technique as long as:

1. The actual sample rate is twice as fast as the rate of change in the observed waveforms;
2. The samples avoid aliasing due to the repetitive form of the 60 Hz line frequency; this is accomplished by sampling at a rate which insures that samples of the current and voltage related signals do not repeat for a large number of cycles of the network frequency or never repeat, for example, a frequency which is an irrational fraction of 60 Hz;
3. Sources of systematic error are reduced or eliminated; the "lead-lag" sampling, to be described in greater detail with reference to FIG. 6(a) and 6(b), accomplishes this;
4. The resolution of the samples is adequate; the "dither" technique ensures full resolution over the average sampling period; and
5. No round-off error is allowed to accumulate.

The above enables an inexpensive 8-bit microprocessor to accomplish what would otherwise require a much more powerful computer to do.

The asynchronous sampling used in the present invention is shown in more detail in FIGS. 7(a) and 7(b).

Because the sample clock frequency is such that it insures that samples of the current and voltage related signals do not repeat for a large number of cycles of the network frequency or never repeat, and is thus offset from an exact multiple of the line frequency, the actual phase position sampled drifts over time, as shown in FIG. 7(a). This gives a much more detailed sampling of the waveform as long as the waveform distortion varies slowly over time or averages towards zero during quick changes. FIG. 7(b) shows the equivalent numbered samples referred to the line frequency waveform.

The resulting total power calculation is correct no matter what ground is used for the voltage reference, as long as the calculations for all three lines use the same ground reference, here the floating grounds 42 to voltage and A for current. This structure allows the same meter to be used for either two-phase or three-phase installations.

As an additional feature, the power meter according to the present invention is operated to record "positive" power flow separately from "negative" power flow. The computer program normally advances the "positive" power register when a fraction of a watt hour has flowed from the utility to the customer. If power flows back to the utility over time, the negative fraction of a watt hour is summed in a separate "negative" register instead of decrementing the "positive" register. Both registers are displayed and read out. This capability provides the utility with separate information for delivered and received power information important to billing practice. This feature also prevents a common type of fraud where a dishonest customer would reverse the current in-out wires for part of a billing period, to cause a normal electromechanical meter to run backwards.

The technique utilized according to the invention is very accurate in determining actual power delivered, despite load distortion of the voltage and current waveforms. The device according to the present invention may actually be more accurate than the electromechanical meters using a motor to average their power readings through changes in the instantaneous torque of the motor.

Although the present invention measures instantaneous power, it may also be useful to know the power factor, even if the concept, as discussed above, is inaccurate. The processor can keep statistics on the current wave shapes and report load factors. It can also keep statistics on the power-usage-per-line. In the two- and three-phase systems, line loading can be imbalanced. These parameters are extra information that could be monitored by equipment to determine load management within the customer's location and within the utility network.

Though the averaging effect and the power factor effect are described separately above for clarity, the two effects actually occur simultaneously in the actual data processing. That is, the instantaneous power is sampled every 0.1 millisecond and added into 10,000 averages of watt-hours each second.

Figures 1, 4B:
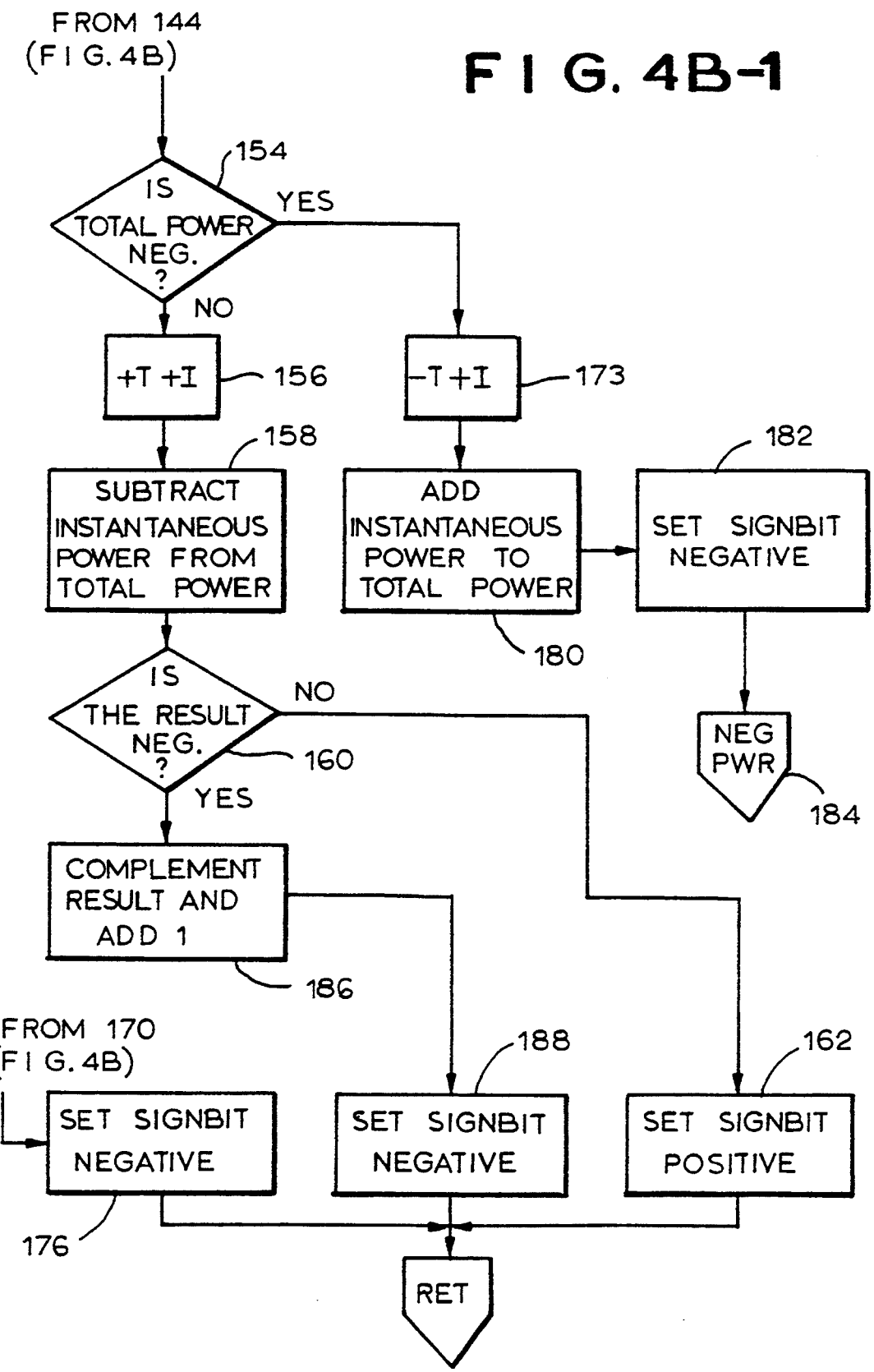
Figure 4C:
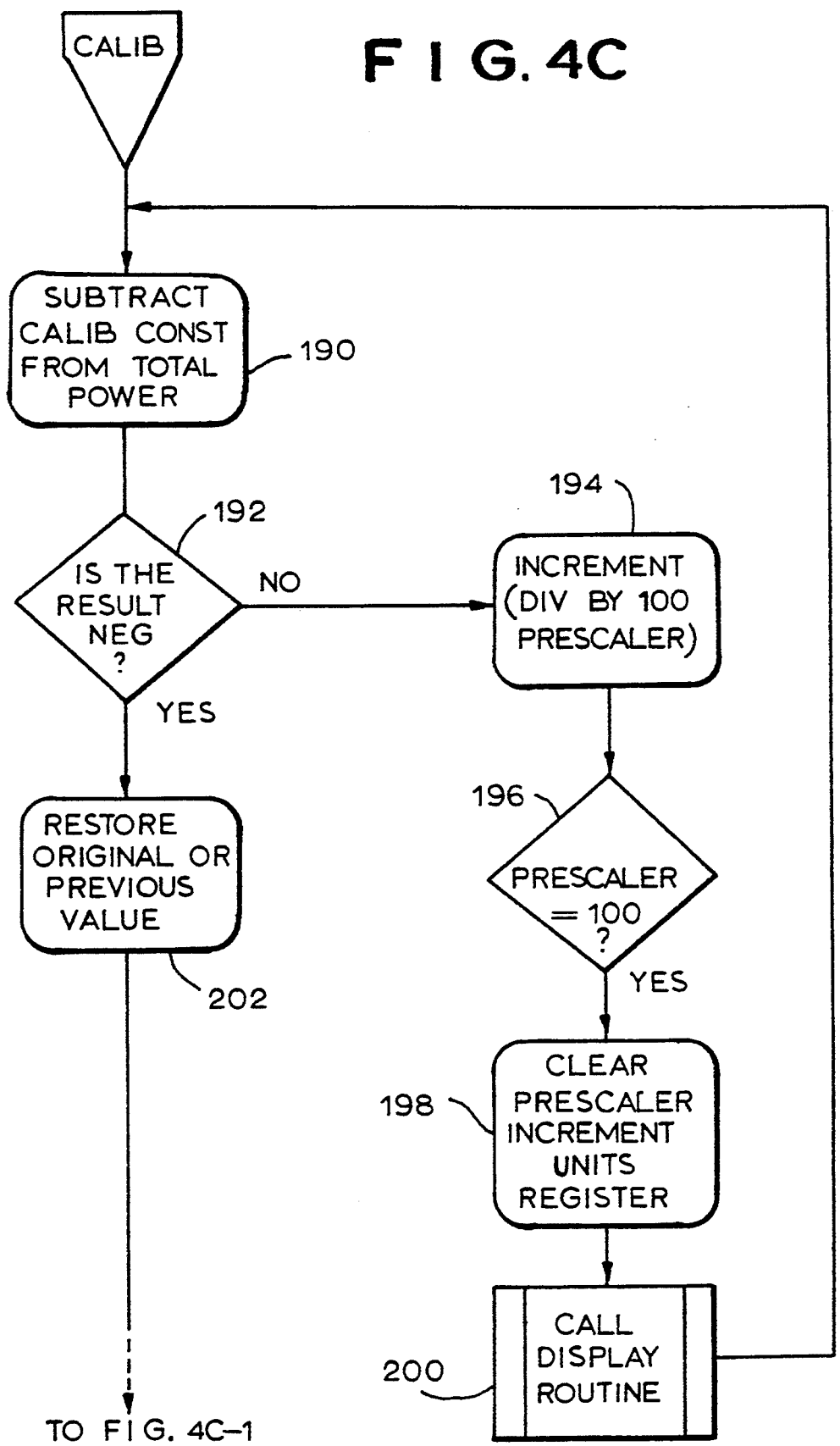
Figures 1, 4C:
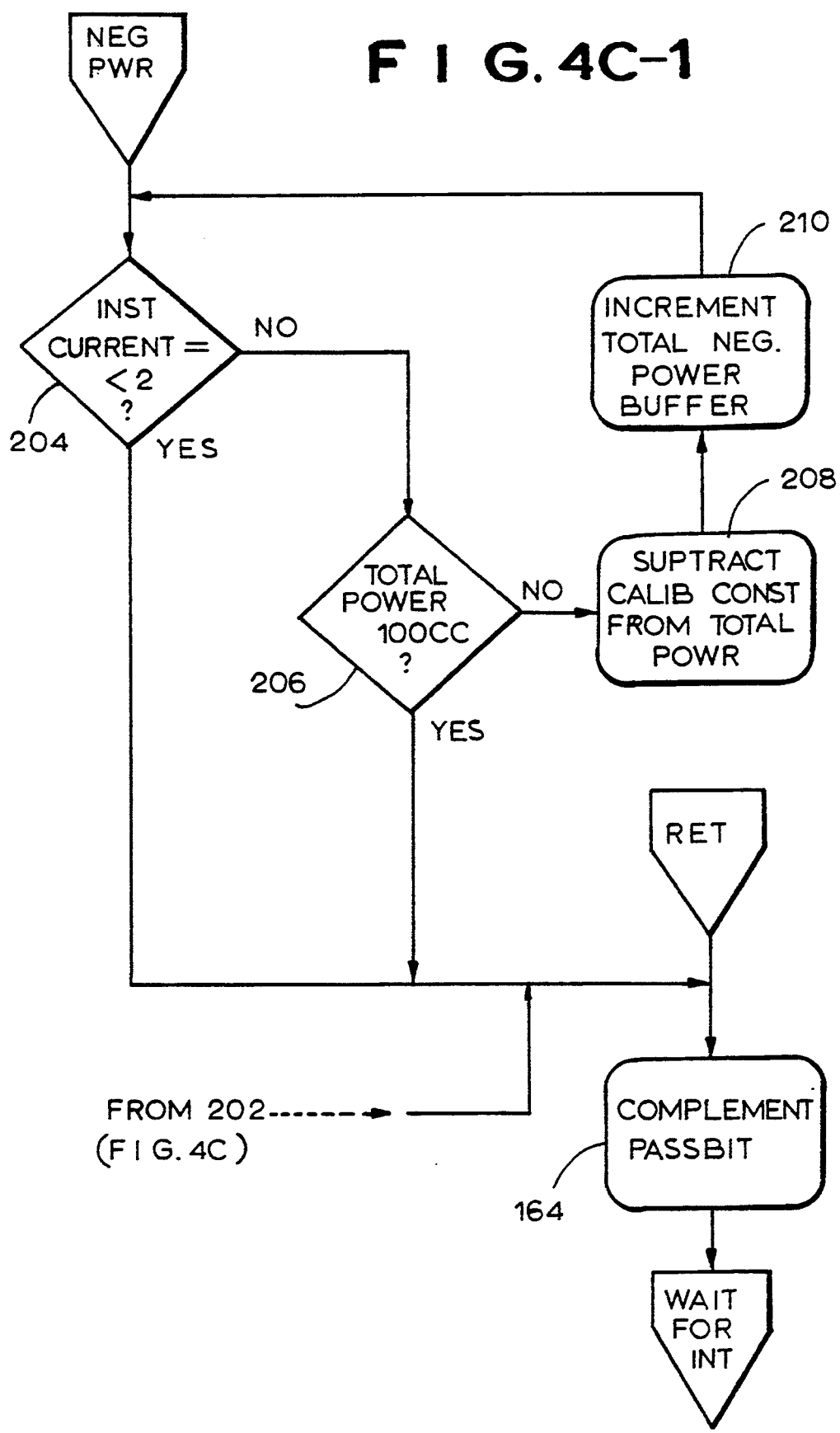

FIGS. 4A, 4B and 4C show the flow chart for the software for calculating power usage implemented by the processor 62. The flow chart shows the processing for a single phase, but the exact same sequence would be repeated for the second phase, and the third phase, if necessary. With reference to FIG. 4A, the initialization begins with a reset at 100 and system initialization at 102. Data is read from the serial nonvolatile RAM 34 at 104. This data includes the total power usage last stored. At 106, a check is made to see if a timer interrupt has occurred. If not, the program stays in a loop. If it has, the timer is loaded with a number to start a new countdown of 5 milliseconds at 108. At 110, a counter is incremented and at 112 the counter is checked to determine if it equals zero. If it does, data is now written to the nonvolatile memory 34 at 114. If it is not equal to zero, a PASSBIT is checked at 116. This PASSBIT determines whether the current for a particular phase is read first or the voltage is read first. Alternate sampling of voltage and current for subsequent measurements of the same phase helps to eliminate errors resulting from systematic sampling offset. As shown in FIG. 3, one analog-to-digital converter is used, combined with a multiplexer (60) to sample both the current and the voltage of each phase. Because there is a slight delay between voltage and current samples for the same phase, the voltage and current are slightly offset, as shown in FIGS. 6(a) and 6(b). This offset, at, can lead to a small but systematic error equivalent to a phase angle error between voltage and current.

To cancel the error, the sequence is reversed from sample group to sample group. That is, in the first set of samples, for each phase, voltage is sampled first. In the next set of samples, for each phase, current is sampled first. In the following set, voltage is again sampled first. The error alternates from $+\Delta t$ to $-\Delta t$. This cancels the systematic error.

Returning to FIG. 4A, if the PASSBIT is set, the current is read first in the sample pair. At 118, the terminal ISENSE at the A-D converter is measured. This gives an instantaneous reading of the dither signal applied to the ISENSE terminal. At 120, the current for the first phase is read and at 122 a subroutine is called which subtracts the ISENSE or instantaneous dither value from the instantaneous current reading. This, therefore, provides a measure of the instantaneous current. At 124, the terminal VSENSE of the A-D converter is read and at 126 the instantaneous voltage for phase 1 is read. At 128, a subroutine is called which subtracts VSENSE from the instantaneous voltage reading, thereby resulting in an accurate measure of the voltage. The reason for the floating ground at VSENSE is to provide a single reference source for the voltage measurements, isolated from each ground or neutral, which as discussed above, may not be at the same potential.

At 130, the power is calculated by multiplying voltage and current for phase 1. A return is then made to the flow chart of FIG. 4B. The next time through the flow chart of FIG. 4A, the second phase will be measured with the voltage-current relationship determined by the PASSBIT. In a two phase system, after the second phase is measured, the first phase will again be measured, with the order of voltage and current measurement reversed. In a three phase network, after the second phase is measured, the third phase is measured before returning to the first phase, at which time the order of the voltage and current measurements for each sample pair is reversed.

As shown in FIG. 4A, if the PASSBIT was not set, as would occur the next time the same phase is measured (i.e., the PASSBIT is complemented), instead of reading current first, voltage would be read first at 132 and 134, the subroutine for determining the instantaneous voltages called at 136, and thereafter the current is measured and determined at 138, 140 and 142, with the determination of power at 130. A return is then made to FIG. 4B.

FIG. 4B shows the calculations for determining total power, and includes the effects of negative power. At 144, determination is made whether the instant power calculated at 130 is negative. If it is not, the total power already accumulated is checked at 146 to determine if it is negative. If it is not, branching is to 148, where the total power is incremented by the incremental instantaneous power, as shown at 150. At 152, the SIGNBIT is set positive for an indication of positive total power and CALIB, shown in FIG. 4C, is entered.

If the instant power is negative, as determined at 144, branching is to 154, where the total accumulated power is again checked to see if it is negative. If it is not, branching is to 156, where the instantaneous power is subtracted from the total power, as shown at 158. At 160, a check is made to determine whether the instantaneous power would have made the total power negative. If not, and total power is positive, the SIGNBIT is set positive at 162 and a return is made to RET at FIG. 4C where the PASSBIT is complemented at 164, so that the next time voltage and current are sensed, it is done in the reverse order from the previous time.

If the instantaneous power measured at 130 was not negative, as measured at 144, but the total power is negative, as determined at 146, then the instantaneous power is subtracted from the total power, as shown at 166 and 168. In the flow chart, the instantaneous power I is added to the negative total power T. At 170, if the result is negative, meaning the total power is positive (instantaneous power was subtracted from total power in 168—since the instantaneous power was positive, as determined at 144, adding the instantaneous power to the total power, which was negative, is the same as subtracting the positive instantaneous power from the absolute value of the total power and complementing the result).

Assuming the total power is made positive by the instantaneous power (|T|-I negative), branching is made to 172, where the total power is complemented and 1 added to the result, in accordance with the two's complement arithmetic in machine language used by the processor. Whenever two values of variables have opposite signs, this process is used to sum them. At 174, the SIGNBIT is set positive and a return is made to CALIB, shown in FIG. 4C. If the result of Step 170 is not negative, but positive (|T|-I positive), meaning the total power is negative, branching is to 176, where the SIGNBIT is set negative and a return is made to RET, shown in FIG. 4C, where the PASSBIT is complemented again.

If the instantaneous power is negative, as determined at 144, and the total power is also negative, as determined at 154, branching is to 178, where the instantaneous and total powers are added, as shown at 180, and the SIGNBIT is set negative, as shown at 182, with branching then to NEG PWR at 184, which returns the program to FIG. 4C.

If the instantaneous power was negative, as determined at 144, and the total power accumulated so far is positive, as determined at 154, branching is to 156, 158 and 160, as described above. At 160, if the result of subtracting the instantaneous power from the total power is negative, meaning the total power is now negative, due to the use of two's complement arithmetic, the result is complemented and 1 added to the result.

The SIGNBIT is set negative to indicate that the total power is negative at 188 and a return is made to RET of FIG. 4C at 164, where the PASSBIT is again complemented.

In FIG. 4C, in the branch entitled "CALIB," calibration for predefined errors is performed. For example, such calibration errors may result from differences between the voltage dividers in each phase or from differences in the current transformers. This branch is entered whenever the instantaneous power is positive. At step 190, the calibration constant is subtracted from the total power. The calibration constant (CALIB) represents one unit of power $V \times I$ as determined during calibration. This unit is illustratively 1/100 watt-hour. TOTAL POWER is a continuous adding of power from the $V \times I$ products of the two or three phases. At 192, the TOTAL POWER is checked to determine its sign. If it is positive, a prescaler register is incremented at 194. One unit of the prescaler register represents 1/100 of a watt-hour. Accordingly, to register one watt-hour, the prescaler register must be cycled through to attain 100. Once the loop has been cycled through so that the prescaler equals 100, as shown at 196, the prescaler is cleared and the UNITS actual power register is incremented by one unit, representing one watt-hour of power consumption, as shown at 198, and the display routine is called at 200 to display the new power usage calculation. A return is then made back to the beginning of the CALIB routine.

If at 192 the total power becomes negative (less than 0 calibration constants), at 202 the original or previous value for the total power is maintained. Thus, in the flow chart shown in FIG. 4C, if the total power register would underflow or be negative, the calibration constant is not subtracted and the previous value of the power is restored. This is because the displayed power usage gives the correct power consumption at that instant. A return is then made after complementing the PASSBIT (step 164) to FIG. 4A, designated WAIT FOR INT to start power calculation again.

If the total power is negative, as determined at step 154 in FIG. 4B, the negative power (NEG PWR) loop of FIG. 4C is entered. At 204, the instantaneous current is checked to determine if it is less than and/or equal to 2. Thus, for small current values, the remainder of the NEG PWR flow is bypassed and a return is made to FIG. 4A after complementing the PASSBIT. This is because for such small currents, negative power need not be determined.

If the instantaneous current is greater than 2, at 206 the total power is checked to determine if it is less than 100 calibration constants (CC). If it is more than 100 CC, the calibration constant is subtracted from the total power at 208. The total negative power buffer is incremented at 210 and a return is made to decision block 204. Since the negative power buffer is not displayed, the display routine is not entered for negative power.

If at 206 the total power is less than 100 (with current greater than 2), a branch is made to 164 where the PASSBIT is complemented and a return is made to FIG. 4A, to start the measurements again. The reason for checking for 100 CC at 206 is to prevent negative power flow during a cycle or during a very short transient (less than 100 CC) from being taken as negative power.

As discussed, if at 204 the instantaneous current is less than or equal to 2, the PASSBIT is complemented at 164 and a return is again made to FIG. 4A for the starting up measurements. Once the TOTAL POWER is less than 100 CC, or becomes positive, the NEG PWR loop will be terminated via step 164 and WAIT FOR INT.

The process described is the same mathematically as dividing $V \times I$ by the calibration constant. The result of this division is the count sent to the "actual power register" (UNITS). Note in the subroutine, the "actual power register" is implemented as a decimal register (prescaler), and each time the lower order byte reaches 100 (step 196) it is zeroed (step 198) and the next highest order byte is incremented (step 198). This simplifies register display.

In the foregoing specification, the invention has been described with reference to specific exemplary embodiments thereof. It will, however, be evident that various modifications and changes may be made thereunto without departing from the broader spirit and scope of the invention as set forth in the appended claims. The specification is, accordingly, to be regarded in an illustrative rather than in a restrictive sense.

What is claimed is:

1. An electric power usage meter for determining electric power usage by a load attached to an electric power network, the power network having a network frequency and voltage and current waveforms, the power usage meter comprising:

first means coupled to each phase of the electric power network for sensing current in each phase;

second means coupled to each phase of the electric power network for detecting the voltage level on each phase;

third means coupled to the first and second means receiving signals from the first means related to the current in each phase and signals from the second means related to the voltage on each phase, said means comprising means for periodically sampling said current and voltage related signals at predetermined times at a frequency which is non-synchronous with the network frequency such that samples defining a cycle of each of the current and voltage related signals are taken over a plurality of cycles of the network waveforms and are not made at the same points on a plurality of successive cycles of the network waveforms of the respective current and voltage related signals and for converting said samples to digital signals representing said current and voltage levels at the predetermined times;

processor means for calculating instantaneous values of power at the predetermined times from the digital signals; and means for accumulating said instantaneous values so as to form a value representative of electrical power usage by the load attached to the network.

2. The electric power usage meter recited in claim 1, further comprising display means coupled to said processor means for displaying said value representative of the electrical power usage.

3. The electric power usage meter recited in claim 2, further comprising power supply means coupled to said network for supplying power to said power usage meter.

4. The electronic power usage meter recited in claim 2, wherein said first means comprises a current transformer coupled to each line of the network.

5. The electric power usage meter recited in claim 4, wherein said second means comprises a voltage divider coupled to each line of the network.

6. The electric power usage meter recited in claim 5, wherein said voltage divider coupled to each line of the network is coupled across said line of the network and a point comprising a floating ground.

7. The electric power usage meter recited in claim 1, wherein said means for sampling samples at a frequency which is an irrational fraction of the network frequency.

8. The electric power usage meter recited in claim 2, further comprising memory means for accumulating said instantaneous values.

9. The electric power usage meter recited in claim 8, wherein said memory comprises a non-volatile memory for storing said accumulated instantaneous value and for maintaining said accumulated value in the event of a power outage.

10. The electric power usage meter recited in claim 9, further comprising battery means coupled to said processor means for supplying power for said memory means in the event of a power outage.

11. The electric power usage meter recited in claim 1, further comprising means for transmitting said accumulated instantaneous values to an external reading device.

12. The electric power usage meter recited in claim 11, wherein said means for transmitting comprises an infrared transmitter.

13. The electric power usage meter recited in claim 11, wherein said means for transmitting further comprises means for receiving data from an external device.

14. The electric power usage meter recited in claim 13, wherein said means for transmitting and receiving comprises an infrared transmitter and receiver.

15. The electric power usage meter recited in claim 1, further comprising means for producing a periodic signal and for superimposing said periodic signal on the signal related to the current in each phase to increase resolution of the conversion of the current related signals to digital signals.

16. The electric power usage meter recited in claim 1, wherein said means for sampling comprises means sampling said voltage and current-related signals repeatedly in sequence such that first one of said signals is sampled and then the other, with the sequence being reversed after both said signals are sampled such that the other of said signals is sampled first and the signal previously sampled first is sampled second, thereby cancelling systematic errors resulting from offset times between sampling of said signals.

17. The electric power usage meter recited in claim 1, and further wherein:
said processor means comprises means for-calculating the amount of electric power usage without implementing actual division and without incurring round-off error, said means for calculating comprising:
means for implementing division by a calibrating constant without performing actual division, said means for implementing division comprising means for repetitively:
multiplying said voltage and current related signals together to form a product and adding said product to an accumulated sum;
after each step of multiplying:
determining if said accumulated sum is larger than said calibration constant, and if so, subtracting said calibration constant from said sum to obtain a result;
incrementing a counter;
again determining if said result is still larger than said calibration constant, and if so, repeating said steps of again determining if said result is still larger than said calibration constant, and if so, repeating said steps of subtracting, incrementing and again determining as many times as necessary until said result is less than said calibration constant;
when said result is less than said calibration constant, maintaining said result as a remainder in a register; and
using the count in said counter and said register as a measure of the electric power usage.

18. The electric power usage meter recited in claim 1, wherein said processor means includes means for calculating instantaneous values of negative power at the predetermined times from the digital signals, indicating power is being supplied to the network, and said means for accumulating said instantaneous values comprises means for accumulating positive and negative instantaneous values of power.

19. An electric power usage meter for determining electric power usage by a load attached to an electric power network, the power network having a network frequency and voltage and current waveforms, the power usage meter comprising:
first means coupled to each phase of the electric power network for sensing current in each phase;
second means coupled to each phase of the electric power network for detecting the voltage level on each phase;
third means coupled to the first and second means receiving signals from the first means related to the current in each phase and signals from the second means related to the voltage on each phase, said means comprising means for periodically sampling said current and voltage related signals at predetermined times at a rate which is non-synchronous with the network frequency such that samples defining a cycle of each of the current and voltage related signals are taken over a plurality of cycles of the network waveforms and are not made at the same points on a plurality of successive cycles of the network waveforms of the respective current and voltage related signals and which rate is at least twice as fast as the rate of change of the current and voltage related signals, and for converting said samples to digital signals representing said current and voltage levels at the predetermined times;
processor means for calculating instantaneous values of power at the predetermined times from the digital signals; and
means for accumulating said instantaneous values so as to form a value representative of electrical power usage by the load attached to the network.

20. The electric power usage meter recited in claim 19, further comprising display means coupled to said processor means for displaying said value representative of the electrical power usage.

21. The electric power usage meter recited in claim 20, further comprising power supply means coupled to said network for supplying power to said power usage meter.

22. The electronic power usage meter recited in claim 20, wherein said first means comprises a current transformer coupled to each line of the network.

23. The electric power usage meter recited in claim 22, wherein said second means comprises a voltage divider coupled to each line of the network.

24. The electric power usage meter recited in claim 23, further comprising means for producing a periodic signal nonsynchronous with the network frequency and for superimposing said periodic signal on the signal from said current transformer thereby to increase resolution of the conversion of said signal from said current transformer to a digital signal.

25. The electric power usage meter recited in claim 23, wherein said voltage divider coupled to each line of the network is coupled across said line of the network and a point comprising a floating ground.

26. The electric power usage meter recited in claim 20, wherein said means for sampling comprises means sampling said voltage and current-related signals repeatedly in sequence such that first one of said signals is sampled and then the other, with the sequence being reversed after both said signals are sampled such that the other of said signals is sampled first and the signal previously sampled first is sampled second, thereby cancelling systematic errors resulting from offset times between sampling of said signals.

27. The electric power meter recited in claim 26, wherein said sequence is reversed only after all phases of the network have been sampled.

28. The electric power usage meter recited in claim 24, wherein said means for producing a periodic signal comprises oscillator means coupled to filter means, said periodic signal comprising a signal having a zero average power.

29. The electric power usage meter recited in claim 20, further comprising memory means for accumulating said instantaneous values.

30. The electric power usage meter recited in claim 20, wherein said memory comprises a non-volatile memory for storing said accumulated instantaneous value and for maintaining said accumulated value in the event of a power outage.

31. The electric power usage meter recited in claim 30, further comprising battery means coupled to said processor means for supplying power for said memory means in the event of a power outage.

32. The electric power usage meter recited in claim 19, further comprising means for transmitting said accumulated instantaneous values to an external reading device.

33. The electric power usage meter recited in claim 32, wherein said means for transmitting comprises an infrared transmitter.

34. The electric power usage meter recited in claim 32, wherein said means for transmitting further comprises means for receiving data from an external device.

35. The electric power usage meter recited in claim 34, wherein said means for transmitting and receiving comprises an infrared transmitter and receiver.

36. The electric power usage meter recited in claim 24, wherein said current transformer is coupled across a line of the network and a point comprising a floating ground.

37. The electric power usage meter recited in claim 36, wherein said periodic signal is applied to said floating ground.

38. The electric power usage meter recited in claim 19, wherein said means for sampling samples at a frequency which is an irrational fraction of the network frequency.

39. The electric power usage meter recited in claim 19, wherein said processor means includes means for calculating instantaneous values of negative power at the predetermined times from the digital signals, indicating power is being supplied to the network, and said means for accumulating said instantaneous values comprises means for accumulating positive and negative instantaneous values of power.

40. Apparatus for providing improved precision in the sampling of a periodic signal which may be subject to load variations comprising:
first means coupled to a source of the periodic signal for detecting the instantaneous value of the signal; and
second means coupled to the first means for periodically sampling the periodic signal at predetermined times at a frequency which is non-synchronous with the periodic signal frequency such that samples defining a cycle of the periodic signal are taken over a plurality of cycles of the periodic signal frequency and are not made at the same points on a plurality of successive cycles of the periodic signal and for converting the samples to digital signals representing the instantaneous levels at the predetermined times.

41. An electric power usage meter for determining electric power usage by a load attached to an electric power network, the power network having a network frequency and voltage and current waveforms, the power usage meter comprising:
first means coupled to each phase of the electric power network for sensing current in each phase;
second means coupled to each phase of the electric power network for detecting the voltage level on each phase;
third means coupled to the first and second means receiving signals from the first means related to the current in each phase and signals from the second means related to the voltage on each phase, said means comprising means for periodically sampling said current and voltage related signals at predetermined times at a frequency which is non-synchronous with the network frequency such that samples defining a cycle of each of the current and voltage related signals are taken over a plurality of cycles of the network waveforms and are not made at the same points on a plurality of successive cycles of the network waveforms of the respective current and voltage related signals and for converting said samples to digital signals representing said current and voltage levels at the predetermined times;
processor means for calculating instantaneous values of power at the predetermined times from the digital signals;
means for accumulating said instantaneous values so as to form a value representative of electrical power usage by the load attached to the network; and further comprising
means for producing a periodic signal non-synchronous with the network frequency and for superimposing said periodic signal on said signals from said first means, thereby to increase resolution of the conversion of said signals from said first means to digital signals without adding net power to the accumulated power usage.

42. An electric power usage meter for determining electric power usage by a load attached to an electric power network, the power network having a network frequency and voltage and current waveforms, the power usage meter comprising:

first means coupled to each phase of the electric power network for sensing current in each phase;

second means coupled to each phase of the electric power network for detecting the voltage level on each phase;

third means coupled to the first and second means receiving signals from the first means related to the current in each phase and signals from the second means related to the voltage on each phase, said means comprising means for periodically sampling said current and voltage related signals at predetermined times at a rate which is non-synchronous with the network frequency such that samples defining a cycle of each of the current and voltage related signals are taken over a plurality of cycles of the network waveforms and are not made at the same points on a plurality of successive cycles of the network waveforms of the respective current and voltage related signals and which rate is at least twice as fast as the rate of change of the current and voltage related signals, and for converting said samples to digital signals representing said current and voltage levels at the predetermined times;

processor means for calculating instantaneous values of power at the predetermined times from the digital signals; and means for accumulating said instantaneous values so as to form a value representative of electrical power usage by the load attached to the network; and further comprising means for producing a periodic signal non-synchronous with the network frequency and for superimposing said periodic signal on said signals from said first means, thereby to increase resolution of the conversion of said signals from said first means to digital signals without adding net power to the accumulated power usage.

43. Apparatus for providing improved precision in the sampling of a periodic signal which may be subject to load variations comprising:

first means coupled to a source of the periodic signal for detecting the instantaneous value of the signal; and second means coupled to the first means for periodically sampling the periodic signal at predetermined times at a frequency which is non-synchronous with the periodic signal frequency such that samples defining a cycle of the periodic signal are taken over a plurality of cycles of the periodic signal frequency and are not made at the same points on a plurality of successive cycles of the periodic signal and for converting the samples to digital signals representing the instantaneous levels at the predetermined times; and further comprising means for producing a periodic signal non-synchronous with the periodic signal frequency and for superimposing said periodic signal on said signals from said first means, thereby to increase resolution of the conversion of said signals from said first means to digital signals without adding a net value due to the superimposed signal to an accumulated sum of said instantaneous levels.

* * * * *